US008855333B2

(12) United States Patent
Kotegawa et al.

(10) Patent No.: US 8,855,333 B2
(45) Date of Patent: Oct. 7, 2014

(54) ULTRASONIC SPEAKER SYSTEM

(71) Applicant: Panasonic Corporation, Osaka (JP)

(72) Inventors: Kazuhisa Kotegawa, Osaka (JP); Fumiyasu Konno, Osaka (JP); Katsu Takeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/148,664

(22) Filed: Jan. 6, 2014

(65) Prior Publication Data
US 2014/0233760 A1    Aug. 21, 2014

(51) Int. Cl.
H03G 3/00    (2006.01)

(52) U.S. Cl.
CPC ....................... H03G 3/00 (2013.01)
USPC ............................ 381/107; 381/77

(58) Field of Classification Search
CPC ...... H04R 2217/03; H04R 1/403; H04R 3/00; H04R 3/12; H04R 19/02; H04R 2499/15; H04R 17/00; H04R 1/40; H04R 2430/01; H04R 2430/03; H04R 2499/13
USPC .......... 381/57–59, 103–107, 77, 79; 181/141; 73/620
See application file for complete search history.

(56) References Cited

U.S. PATENT DOCUMENTS

| 5,889,870 A * | 3/1999 | Norris .............................. 381/77 |
| 7,729,498 B2 * | 6/2010 | Spencer et al. .................. 381/77 |
| 2007/0183605 A1 * | 8/2007 | Yoshino et al. .................. 381/59 |
| 2013/0022208 A1 * | 1/2013 | Dhuyvetter ..................... 381/55 |

FOREIGN PATENT DOCUMENTS

| JP | 60-075199 A | 4/1985 |
| JP | 2005-286579 A | 10/2005 |
| JP | 2007-235930 A | 9/2007 |
| JP | 2011-103543 A | 5/2011 |

* cited by examiner

Primary Examiner — Lun-See Lao
(74) Attorney, Agent, or Firm — McDermott Will & Emery LLP

(57) ABSTRACT

An ultrasonic speaker system has a first variable gain block, a modulation block, a second variable gain block, an ultrasonic actuator, and a controller, wherein the controller controls gain of the first variable gain block so that a modulation degree of a modulated signal becomes a predetermined value, and when the controller raises the gain of the first variable gain block, the controller lowers the gain of the second variable gain block, while when the controller lowers the gain of the first variable gain block, the controller raises the gain of the second variable gain block.

6 Claims, 2 Drawing Sheets

ULTRASONIC SPEAKER SYSTEM

RELATED APPLICATIONS

This application claims the benefit of Japanese Application No. 2013-028687, filed on Feb. 18, 2013, the disclosure of which Application is incorporated by reference herein.

BACKGROUND OF THE INVENTION

1. Field of the Invention

The present invention relates to an ultrasonic speaker system that reproduces signal sound in an audiofrequency band, using non-linearity of a medium (e.g., air) to an ultrasonic wave.

2. Description of the Related Art

An ultrasonic speaker system, having very strong directivity as compared with an ordinary speaker, is used for the purpose of transmission of speech information only to a specific place, or the like. For example, in an exhibition hall such as an art museum and the like, an ultrasonic speaker is installed so that when people approach a certain work, only a person within a limited range near the work can hear an explanation about the work.

FIG. 2 is a diagram showing a configuration of a conventional ultrasonic speaker system. As shown in FIG. 2, the conventional ultrasonic speaker system has modulation block 102, amplifier 103, and ultrasonic actuator 104. A speech signal is outputted from speech signal source 101 and the speech signal is inputted to modulation block 102. In modulation block 102, a modulated signal is generated based on the speech signal, and the modulated signal is inputted to amplifier 103. Amplifier 103 amplifies the modulated signal outputted from modulation block 102, and the amplified modulated signal is inputted from amplifier 103 to ultrasonic actuator 104. Ultrasonic actuator 104 converts the modulated signal to an acoustic wave of a finite amplitude level and radiates the acoustic wave of the finite amplitude level to a medium.

As one example of the modulated signal generated in modulation block 102, an AM modulated signal that modulates an amplitude of an ultrasonic wave (carrier wave) by a speech signal is considered.

As related-art document information regarding the invention of the present application, for example, Patent Document 1 has been known. (Patent Document 1: Unexamined Japanese Patent Publication No. S60-75199)

SUMMARY OF THE INVENTION

One aspect of an ultrasonic speaker system of the present invention includes a first variable gain block for receiving a speech signal outputted from a speech signal source, a modulation block for receiving the speech signal outputted from the first variable gain block, a second variable gain block for receiving a modulated signal generated in the modulation block based on the speech signal, an ultrasonic actuator that is driven by the modulated signal outputted from the second variable gain block, coverts the modulated signal to an acoustic wave of a finite amplitude level, and radiates the acoustic wave into a medium, and a controller that controls the first variable gain block and the second variable gain block, wherein the controller controls gain of the first variable gain block so that a degree of the modulated signal becomes a predetermined value, and when the gain of the first variable gain block is 1 or more, the controller controls gain of the second variable gain block so that the gain of the second variable gain block becomes 1 or less.

For example, in the ultrasonic speaker system, the controller controls the gain of the first variable gain block so that the modulation degree of the modulated signal becomes the predetermined value (a value at which sound quality properties such as a level of audible sound pressure, harmonic distortion and the like are in a favorable state, when in the ultrasonic actuator, the speech signal is converted to the acoustic wave to be radiated into the medium). Accordingly, even if sound volume of the speech signal is changed by a user as needed, the modulation degree of the modulated signal does not largely deviate from the predetermined value. Furthermore, since when the gain of the first variable gain block is 1 or more, the controller controls the gain of the second variable gain block so that the gain of the second variable gain block becomes 1 or less (e.g., since even if in order to set the modulation degree to the predetermined value, the gain of the first variable gain block is set to 1 or more, the gain of the second variable gain block is changed to 1 or less by the controller), a sound volume level of sound coming from the ultrasonic speaker system can be prevented from largely deviating from a sound volume level selected and assumed by the user. Therefore, the ultrasonic speaker system constantly excellent in sound quality properties can be provided.

DETAILED DESCRIPTION OF THE PREFERRED EMBODIMENT

A problem of a conventional ultrasonic speaker system will be described prior to description of an exemplary embodiment.

In conventional ultrasonic speaker system 100, when the AM modulated signal is inputted to ultrasonic actuator 104, and the acoustic wave is radiated into the medium through ultrasonic actuator 104, an optimum value of a modulation degree of the modulated signal is uniquely decided in accordance with modulation algorithm used in modulation block 102. However, conventional ultrasonic speaker system 100 has a problem that when a sound volume level of the speech signal outputted from speech signal source 101 is changed by a user as needed, the modulation degree of the modulated signal generated in modulation block 102 is changed, and the modulation degree deviates from the optimum value, thereby causing sound quality degradation such as decrease in pressure of audible sound radiated from an ultrasonic speaker, increase in harmonic distortion, and the like.

Exemplary Embodiment

Figure 1:
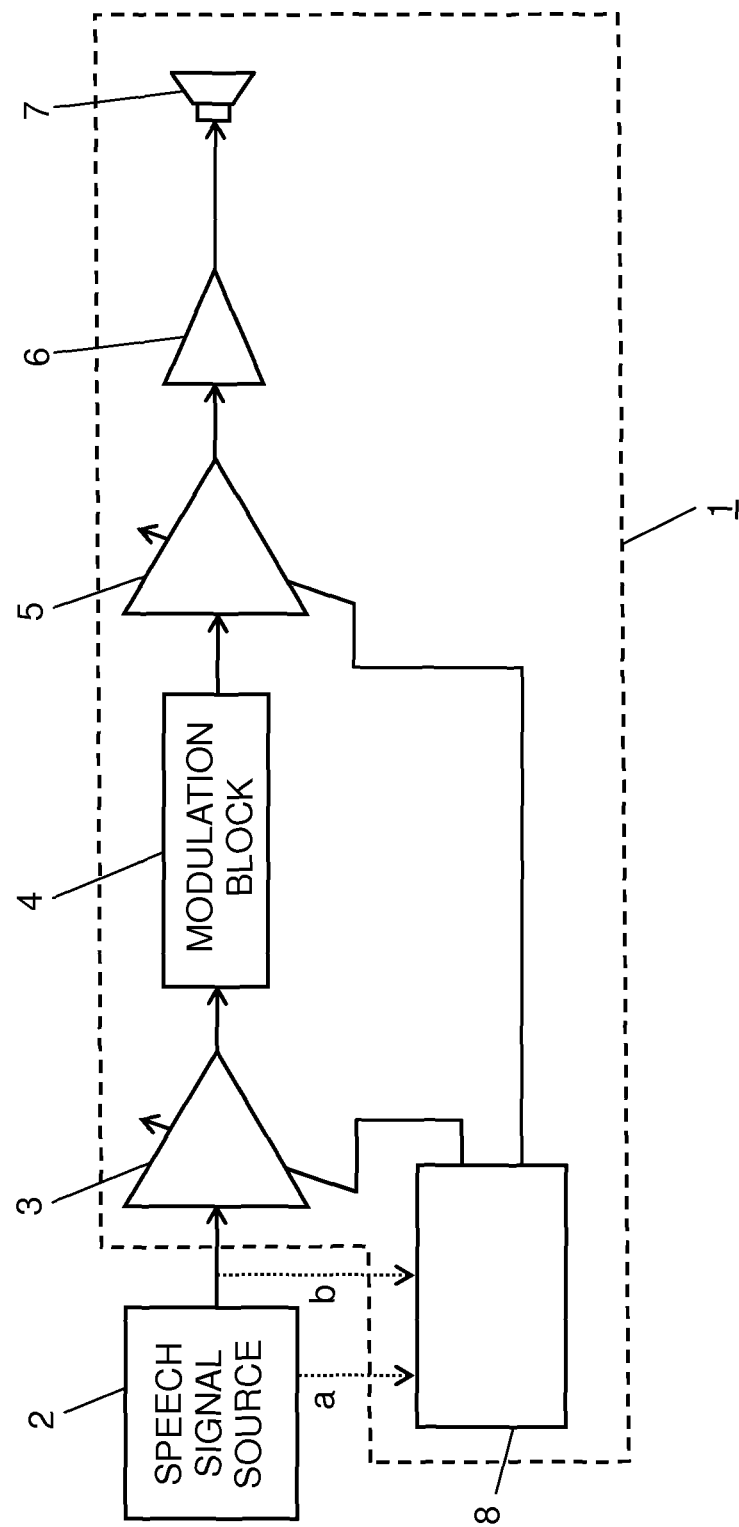
FIG. 1 is a block diagram of an ultrasonic speaker system according to an exemplary embodiment of the present invention.
Figure 2:
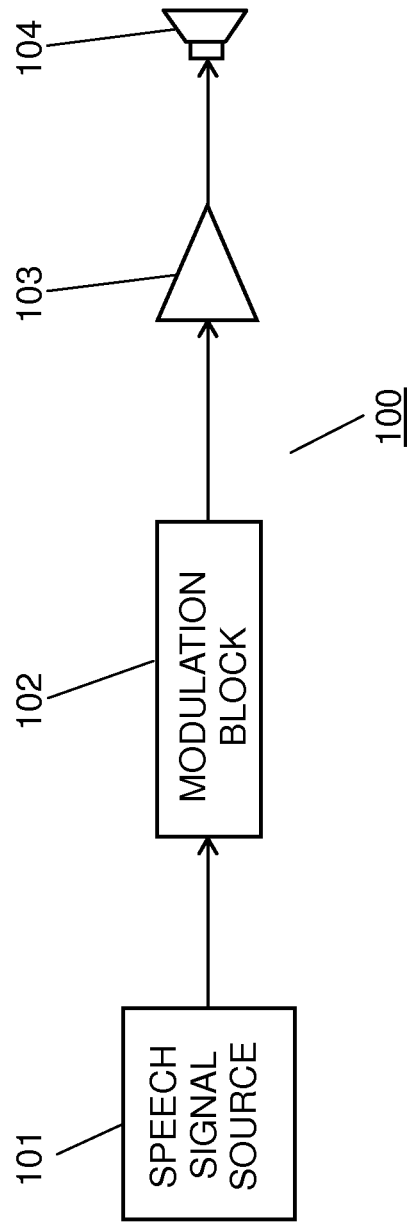
FIG. 2 is a block diagram of a conventional ultrasonic speaker system.

Hereinafter, a sensor of the present invention according to a first exemplary embodiment will be described with reference to FIG. 1. As shown in FIG. 1, an ultrasonic speaker system 1 of the present exemplary embodiment has a first variable gain block 3, a modulation block 4, a second variable gain block 5, an amplifier 6, an ultrasonic actuator 7, and a controller 8. A speech signal is outputted from a speech signal source 2, and the speech signal is inputted to first variable gain block 3. The speech signal outputted from first variable gain block 3 is inputted to modulation block 4. In modulation block 4, a modulated signal is generated based on the speech signal. The modulated signal outputted from modulation block 4 is inputted to second variable gain block 5. Amplifier 6 amplifies the modulated signal outputted from second variable gain block 5, and the amplified modulated signal is inputted to ultrasonic actuator 7. Ultrasonic actuator 7 converts the modulated signal inputted from amplifier 6 to an acoustic wave of a finite amplitude level and radiates the acoustic wave of the finite amplitude level into a medium. Controller 8 controls first variable gain block 3 and second variable gain block 5. Control methods in controller 8 will be described below.

Controller 8 controls gain of first variable gain block 3 so that a modulation degree of the modulated signal becomes a predetermined value. When the gain of first variable gain block 3 is controlled to be 1 or more by controller 8, controller 8 controls gain of second variable gain block 5 so that the gain becomes 1 or less. In contrast, when the gain of first variable gain block 3 is controlled to be a value smaller than 1 by controller 8, controller 8 controls the gain of second variable gain block 5 so that the gain becomes a value larger than 1.

As methods for controlling the gain of first variable gain block 3 so that the modulation degree of the modulated signal generated in modulation block 4 becomes the predetermined value, for example, two methods are considered.

First, the first method will be described. Sound volume information (dotted line arrow a in FIG. 1) is inputted from speech signal source 2 to controller 8. Controller 8 decides a gain value of first variable gain block 3 based on the inputted sound volume information. Here, the sound volume information is information indicating a sound volume level selected by the user. As examples of the sound volume information, volume information of the speech signal source, an index indicating an average magnitude of amplitude and a value indicating an amplitude maximum value of the speech signal outputted from speech signal source 2, and the like are exemplified.

Here, a case where the modulated signal generated in modulation block 4 is an AM modulated signal has been described as an example. The modulation degree of the AM modulation is decided based on the amplitude maximum value of the speech signal and an amplitude maximum value of an ultrasonic wave (carrier wave). Thus, controller 8 can derive the gain value of first variable gain block 3 necessary for generating the modulated signal of the predetermined modulation degree based on the sound volume information.

When for the modulated signal generated in modulation block 4, a modulation method other than the AM modulation is employed as well, similar to the AM modulation, controller 8 can calculate the modulation degree, as long as the amplitude maximum value of the speech signal can be derived.

Next, the second method will be described. First, a part of the speech signal (dotted line arrow b in FIG. 1) outputted from speech signal source 2 is inputted to controller 8. Controller 8 derives the sound volume information from the inputted speech signal. Next, the gain value of first variable gain block 3 is decided based on the derived sound volume information. As examples of a method for deriving the sound volume information, there are a method of integrating the acquired speech signal, a method of using a peak value and an average value of an envelope of the speech signal and so on.

As the methods for deciding the gain value of first variable gain block 3 by controller 8, as described above, the two methods have been exemplified. The sound volume information of the speech signal may be obtained by methods other than these two methods. That is, as long as controller 8 can obtain information equivalent to the amplitude maximum value of the speech signal, controller 8 can calculate the modulation degree.

As described above, in the ultrasonic speaker system of the present exemplary embodiment, even if the user changes the sound volume level, the modulation degree of the modulated signal outputted from modulation block 4 can be converged to the optimum predetermined value. Thus, the ultrasonic speaker system excellent in sound quality properties can be provided.

Moreover, in the ultrasonic speaker system of the present exemplary embodiment, when the gain of first variable gain block 3 is 1 or more, controller 8 controls the gain of second variable gain block 5 so that the gain becomes 1 or less. Accordingly, the sound volume level of sound coming from the ultrasonic speaker system does not largely deviate from the sound volume level selected and assumed by the user. That is, controller 8 controls the gain value of first variable gain block 3 so that the modulation degree of the modulated signal generated in modulation block 4 becomes the predetermined value. As a result, even if the user changes the selected sound volume level, the gain value of second variable gain block 5 is changed in a direction reverse to a change direction of the gain value of first variable gain block 3 (i.e., it means that when the gain of first variable gain block 3 is changed to 1 or more, the gain value of second variable gain block 5 is changed to 1 or less), which prevents the sound volume level of the sound coming from the ultrasonic speaker system from largely deviating from the sound volume level selected by the user.

That is, controller 8 performs control so that when the gain of first variable gain block 3 is raised, the gain of second variable gain block 5 is brought down in combination, and when the gain of first variable gain block 3 is brought down, the gain of second variable gain block 5 is raised in combination. Thus, the sound volume level of the sound coming from the ultrasonic speaker system does not largely deviate from the sound volume level selected by the user.

Moreover, controller 8 may control the gain value of first variable gain block 3 and the gain value of second variable gain block 5 so that a relationship between a gain value G1 of first variable gain block 3 and a gain value G2 of second variable gain block 5 becomes G1=1/G2.

Performing the above-described control enables the sound volume at which the user hears to precisely match the sound volume level selected by the user.

Moreover, a method for deciding the gain value G1 of the first variable gain block and the gain value G2 of the second variable gain block may include use of data in a look-up table calculated in advance.

Furthermore, controller 8 may set the gain of second variable gain block 5 to zero, when a level of the speech signal is a predetermined value or less.

Controller 8 performing the above-described control can stop output of the carrier wave, when the speech signal inputted to the ultrasonic speaker system is a non-signal, or a small signal near the non-signal. This can suppress power consumption when the non-signal or the small signal near this is inputted.

The gain value G1 in G1=1/G2 is decided based on the sound volume information, as described above.

Amplifier 6 shown in FIG. 1 generally has an amplification function of current and voltage, and can drive the ultrasonic actuator. While the ultrasonic speaker system shown in FIG. 1 has amplifier 6, the ultrasonic speaker system does not necessarily have amplifier 6. In an ultrasonic speaker system not having amplifier 6, the modulated signal outputted from second variable gain block 5 is directly inputted to ultrasonic actuator 7. Even the above-described configuration brings about an effect similar to that of the ultrasonic speaker system shown in FIG. 1, as long as the variable gain block has a sufficient current supply ability for the actuator.

As described above, the ultrasonic speaker system of the present invention, being excellent in sound quality properties such as a level of audible sound pressure, harmonic distortion and the like, is useful, for example, for audio reproduction and speech reproduction of small sound volume, and the like.

What is claimed is:

1. An ultrasonic speaker system comprising:
    a first variable gain block for receiving a speech signal outputted from a speech signal source;
    a modulation block for receiving the speech signal outputted from the first variable gain block;
    a second variable gain block for receiving a modulated signal generated in the modulation block based on the speech signal;
    an ultrasonic actuator that is driven by the modulated signal outputted from the second variable gain block, coverts the modulated signal to an acoustic wave of a finite amplitude level, and radiates the acoustic wave into a medium; and
    a controller that controls the first variable gain block and the second variable gain block,
    wherein the controller controls gain of the first variable gain block so that a modulation degree of the modulated signal becomes a predetermined value,
    when the controller raises the gain of the first variable gain block, the controller lowers gain of the second variable gain block, and
    when the controller lowers the gain of the first variable gain block, the controller raises the gain of the second variable gain block.

2. The ultrasonic speaker system according to claim 1, wherein the controller receives sound volume information from the speech signal source, and controls the gain of the first variable gain block and the gain of the second variable gain block according to the sound volume information.

3. The ultrasonic speaker system according to claim 1, wherein the controller receives a part of the speech signal outputted from the speech signal source, derives sound volume information from the inputted speech signal, and controls the gain of the first variable gain block and the gain of the second variable gain block according to the sound volume information.

4. The ultrasonic speaker system according to claim 1, wherein a relationship between a gain value G1 of the first variable gain block and a gain value G2 of the second variable gain block is G1=1/G2.

5. The ultrasonic speaker system according to claim 1, wherein a method for deciding gain value G1 of the first variable gain block and gain value G2 of the second variable gain block includes use of data in a look-up table calculated in advance.

6. The ultrasonic speaker system according to claim 1, wherein the controller sets the gain of the second variable gain block to zero, when a level of the speech signal is a predetermined value or less.

* * * * *